United States Patent [19]

Brauch

[11] Patent Number: 5,745,419
[45] Date of Patent: Apr. 28, 1998

[54] METHOD AND APPARATUS FOR MEASURING THE OFFSET VOLTAGES OF SRAM SENSE AMPLIFIERS

[75] Inventor: Jeffery C. Brauch, Fort Collins, Colo.

[73] Assignee: Hewlett-Packard Co., Palo Alto, Calif.

[21] Appl. No.: 690,631

[22] Filed: Jul. 30, 1996

[51] Int. Cl.$^6$ ................................................. G11C 29/00
[52] U.S. Cl. ...................... 365/201; 365/23.03; 365/207; 365/205
[58] Field of Search ................................ 365/201, 230.03, 365/207, 205, 154

[56] References Cited

U.S. PATENT DOCUMENTS

| | | | |
|---|---|---|---|
| 5,559,745 | 9/1996 | Banik et al. | 365/201 |
| 5,566,113 | 10/1996 | Saito et al. | 365/201 |
| 5,568,434 | 10/1996 | Jeon | 365/201 |
| 5,668,766 | 9/1997 | Bramnik | 365/207 |

*Primary Examiner*—David C. Nelms
*Assistant Examiner*—Huan Hoang

[57] ABSTRACT

Disclosed herein is a method of measuring the offset voltages of a plurality of SRAM sense amplifiers. The method comprises applying a series of stepped differential voltages to the plurality of sense amplifiers. After applying each differential voltage, an SRAM read operation is performed. The output of each sense amplifier may be interpreted with respect to the applied differential voltages. The point where a sense amplifier's output changes polarity will indicate a sense amplifier's offset voltage characteristic. Apparatus disclosed for implementing the method provides apparatus for isolating offset voltage test circuitry from other components of the SRAM while the SRAM is in a normal operating mode.

13 Claims, 4 Drawing Sheets

METHOD AND APPARATUS FOR MEASURING THE OFFSET VOLTAGES OF SRAM SENSE AMPLIFIERS

BACKGROUND OF THE INVENTION

This invention pertains to the measurement of sense amplifier offset voltages in a static random access memory (hereinafter referred to as an "SRAM"). More particularly, this invention pertains to methods and apparatus which allow an engineer to gather precise statistical data on the offset voltage characteristics of sense amplifiers used in a particular SRAM design or fabrication process. The statistical data can then be used for purposes such as 1) increasing the speed of an SRAM, or 2) decreasing the size of an SRAM.

The accurate measurement of sense amplifier offset voltages is a very important factor in generating a timing budget for an SRAM. On one hand, enough time must be allotted during each clock cycle of SRAM operation to guarantee that the bit lines driven by each random access memory cell (hereinafter referred to as a "RAM cell") develop sufficient differential voltage to overcome the offset voltages of the sense amplifiers to which they are connected. On the other hand, it is undesirable to allot any more time for bit line charging than is necessary, since an SRAM's operating speed is directly and adversely impacted by time allotted to developing excess differential voltages across bit lines.

It is therefore desirable to accurately determine sense amplifier offset voltages so that an SRAM's timing budget allows "just enough" time for its RAM cells to charge their associated bit lines.

In the past, the offset voltages of sense amplifiers contained in a production SRAM have been difficult to measure. When measured, offset voltages have been obtained through the manufacture of special SRAM prototypes with added testability features. Since this is an expensive and time consuming process, mathematical models of an SRAM are often used to estimate the offset voltages of an SRAM's sense amplifiers.

Modeling has several disadvantages. First, there are some characteristics of an SRAM that cannot be accurately modeled. The offset voltage and drain current of a field effect transistor (fet) are two such characteristics. These characteristics are the two most fundamental quantities used in fet modeling, and their interaction as a fet is just beginning to turn on is very important to the modeling of a sense amplifier. Unfortunately, mathematical models are often based on generalized or inappropriate process data, such as the use of vertically packaged fets rather than horizontally packaged fets. Although such a modeling inaccuracy might appear negligible, it could translate into a relatively large error when it comes to predicting a sense amplifier's rather small offset voltage.

Second, and in order to account for modeling inaccuracies, the SRAM timing budget produced by modeling must be conservative. Failure to allot enough time for bit line charging can result in loss of data or data errors.

It is therefore a primary object of this invention to provide methods and apparatus for accurately measuring the offset voltages of each and every sense amplifier in an SRAM (or alternatively, a subset of sense amplifiers within an SRAM).

It is a further object of this invention to provide methods and apparatus which do not detrimentally effect the normal operation of an SRAM.

It is yet another object of this invention to provide methods and apparatus which provide statistically significant offset voltage data for a specific SRAM design or fabrication process, thereby enabling the creation of SRAM timing budgets which allot "just enough" time for bit line charging and the overcoming of sense amplifier offset voltages.

SUMMARY OF THE INVENTION

In the achievement of the foregoing objects, the inventor has devised a method of measuring the offset voltages of a plurality of sense amplifiers. The method comprises applying a series of stepped differential voltages to the plurality of sense amplifiers. After applying each differential voltage, an SRAM read operation is performed. The output of each sense amplifier may be interpreted with respect to the applied differential voltages. The point where a sense amplifier's output changes polarity will indicate a sense amplifier's offset voltage characteristic.

It is inevitable that due to manufacturing variations, some sense amplifiers will have offset voltages which are slightly higher or lower than the norm. If an SRAM timing budget is designed to account for these variations, and only these variations, an SRAM can be timed for maximum operating efficiency.

As earlier stated, the offset voltages of sense amplifiers have previously been estimated through modeling. When measured (which is rare), offset voltages have been obtained from a prototype—the prototype being nothing more than another model. Due to the many unknowns which must be accounted for in a modeling process, the time allotted for overcoming sense amplifier offset voltages has often been much greater than necessary. The methods and apparatus disclosed herein allow for more precise timing budgets, which in turn yield speedier and/or smaller SRAMs.

The disclosed apparatus provides a means for disabling and isolating offset voltage test circuitry during the normal operation of an SRAM.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 5:
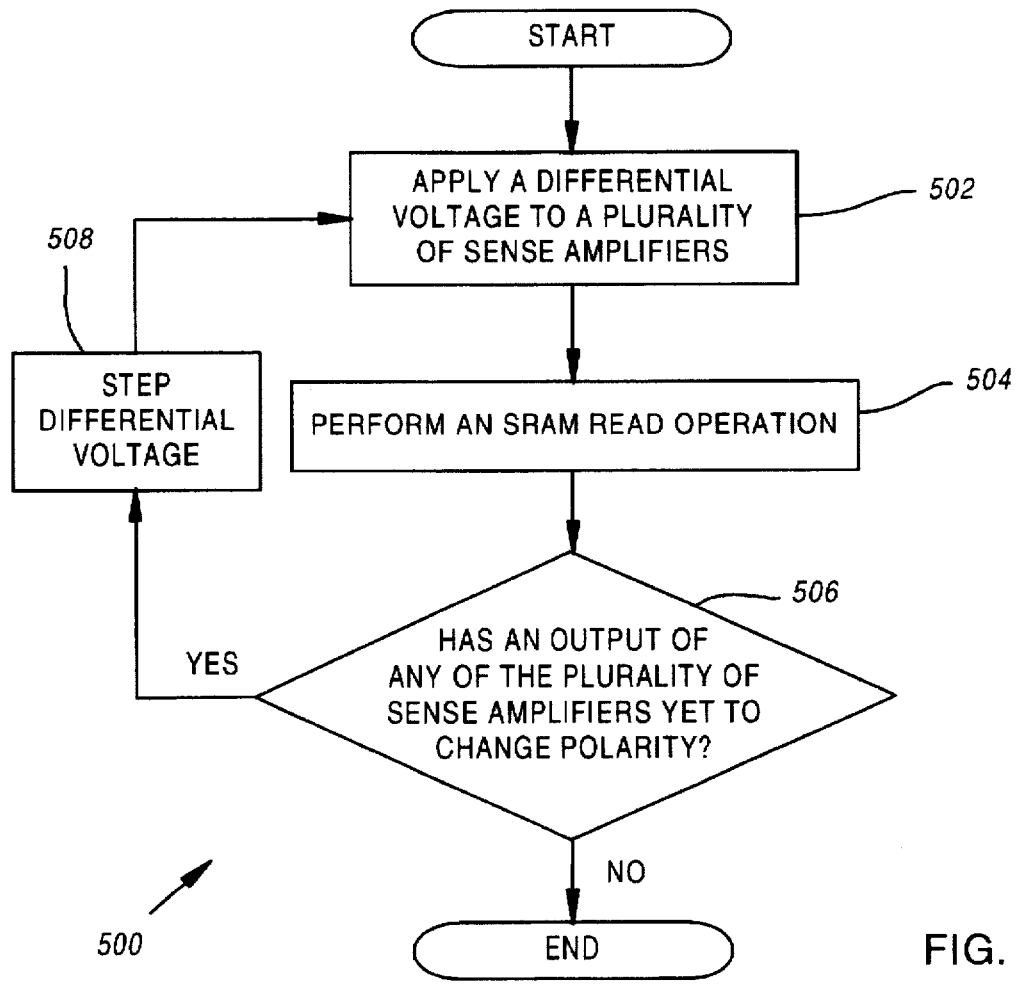
FIG. 5 is a flow chart illustrating the steps involved in accurately measuring the offset voltages of an SRAM's sense amplifiers.

A method 500 of accurately measuring the offset voltages of a plurality of sense amplifiers 164–168 (FIG. 2) in an SRAM 200 has been graphically illustrated in the flow chart of FIG. 5. The method 500 may generally commence with the application 502 of a differential voltage to the plurality of sense amplifiers 164–168. After the differential voltage is applied 502, an SRAM read operation may be performed 504. If the output 182–186 of any of the plurality of sense amplifiers 164–168 has yet to change polarity 506, the differential voltage applied to the plurality of sense amplifiers 164–168 may be stepped 508, 502, and the SRAM read operation may be repeated 504.

Figure 2:
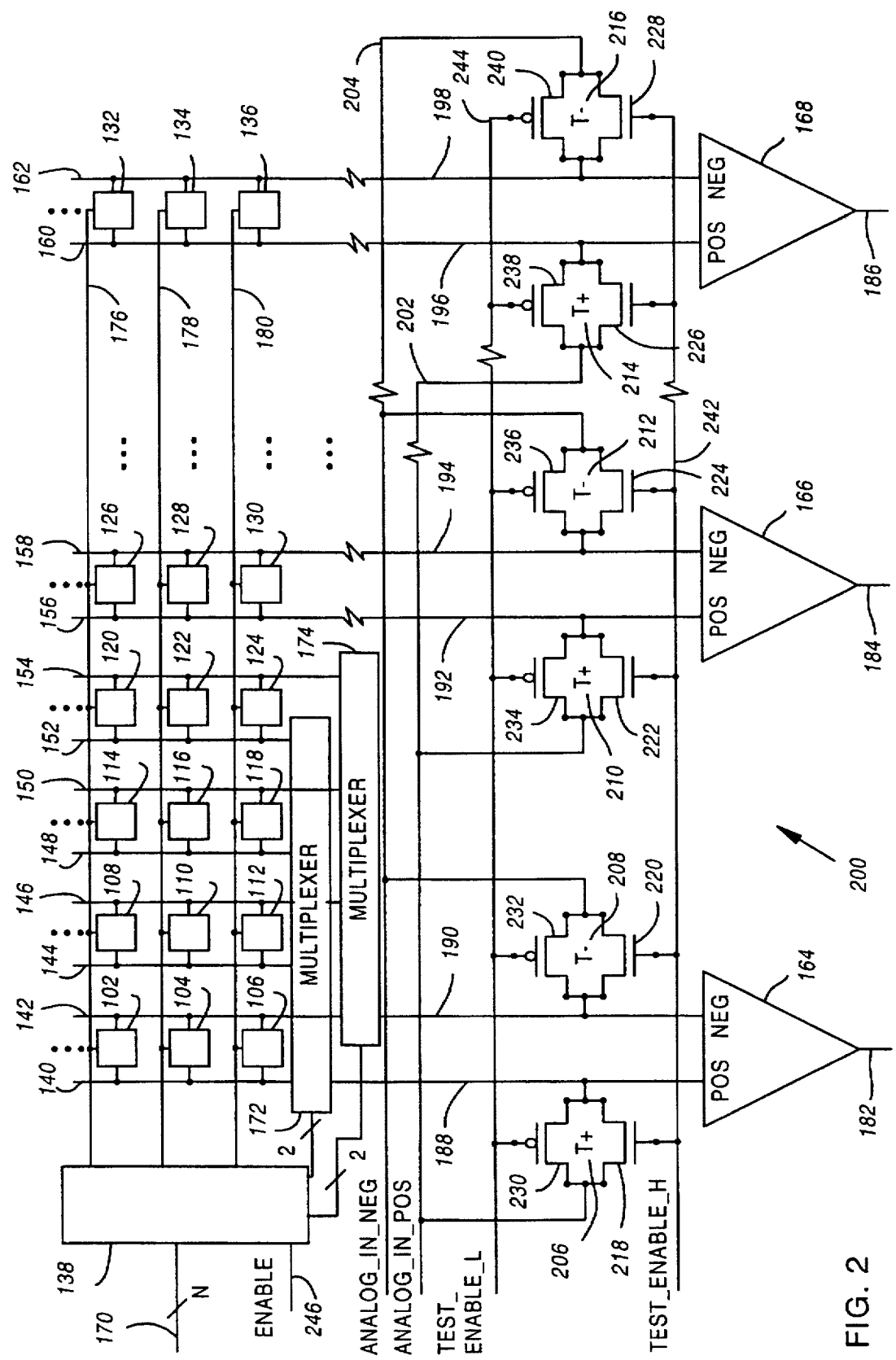
FIG. 2 is a schematic illustrating how apparatus for measuring the offset voltages of sense amplifiers cooperates with components of the SRAM cross-section of FIG. 1.
Figure 3:
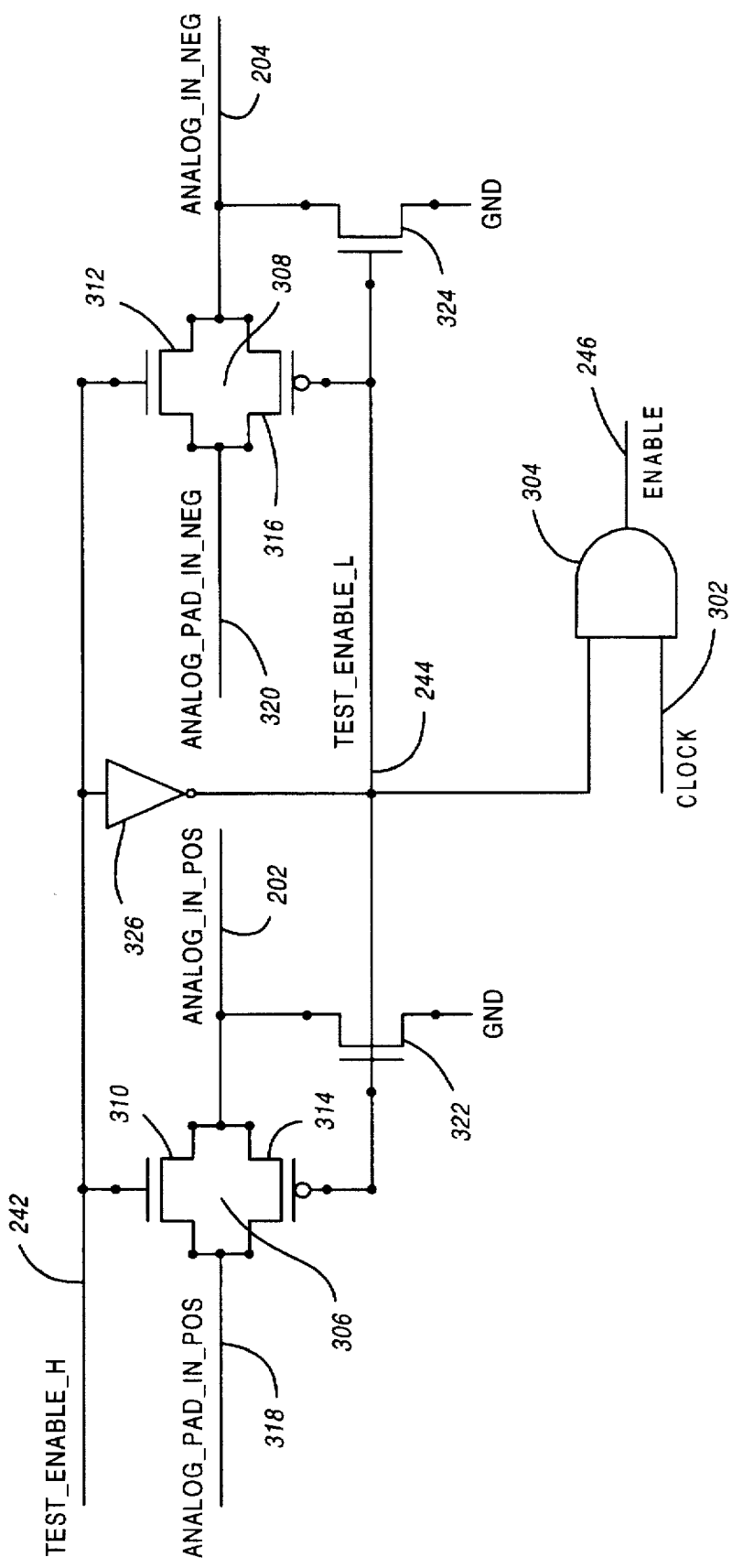
FIG. 3 is a schematic illustrating circuitry which may be used in isolating offset voltage test circuitry from an SRAM during normal operation of the SRAM.
Figure 4:
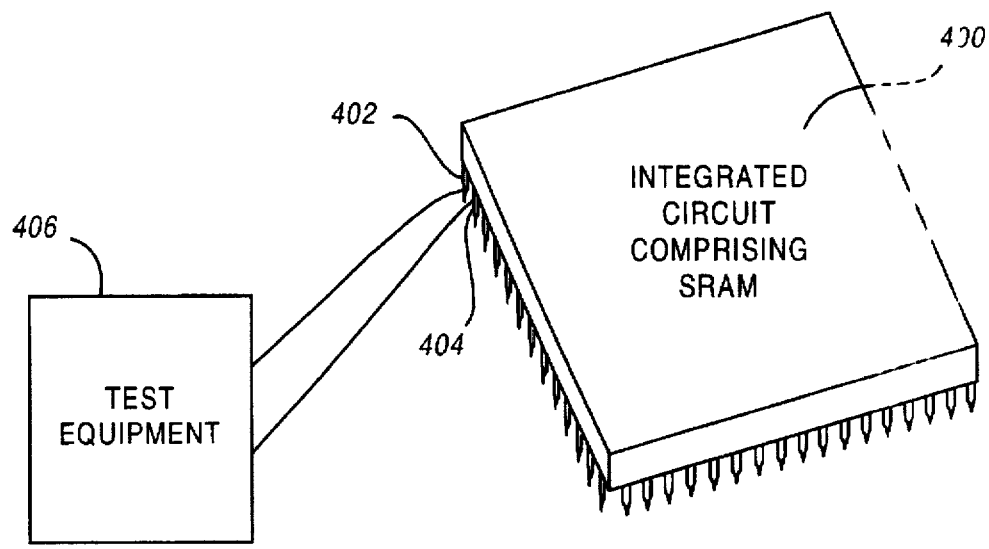
FIG. 4 is a schematic illustrating an integrated circuit comprising an SRAM.

Apparatus for applying the above method is pictured in FIGS. 2–4. The apparatus may generally comprise means 202, 204, 206–216, 406 for applying a differential voltage to the plurality of sense amplifiers 164–168, and means for performing an SRAM read operation. The apparatus may also comprise means 406 for stepping the differential voltage applied to the plurality of sense amplifiers and causing the SRAM read operation to be repeated. This last means 406 is typically responsive to which outputs of the plurality of sense amplifiers have changed polarity.

Alternatively, apparatus for measuring the offset voltages of a plurality of sense amplifiers 164–168 in an SRAM 200 (FIG. 2) may generally comprise one or more analog voltage signal lines 202, 204, one or more test enable signal lines 242, 244, and a plurality of transmission gates 206–216. Each of the transmission gates 206–216 connects one of the analog voltage signal lines 202, 204 to an input 188–198 of one of the plurality of sense amplifiers 164–168. The operability of each transmission gate 206–216 is controlled by one or more signals carried over one or more of the test enable signal lines 242, 244.

Having generally described a method 500 of accurately measuring the offset voltages of an SRAM's sense amplifiers 164–168, and SRAM test circuitry for implementing same, the method 500 and apparatus will now be described in further detail.

Figure 1:
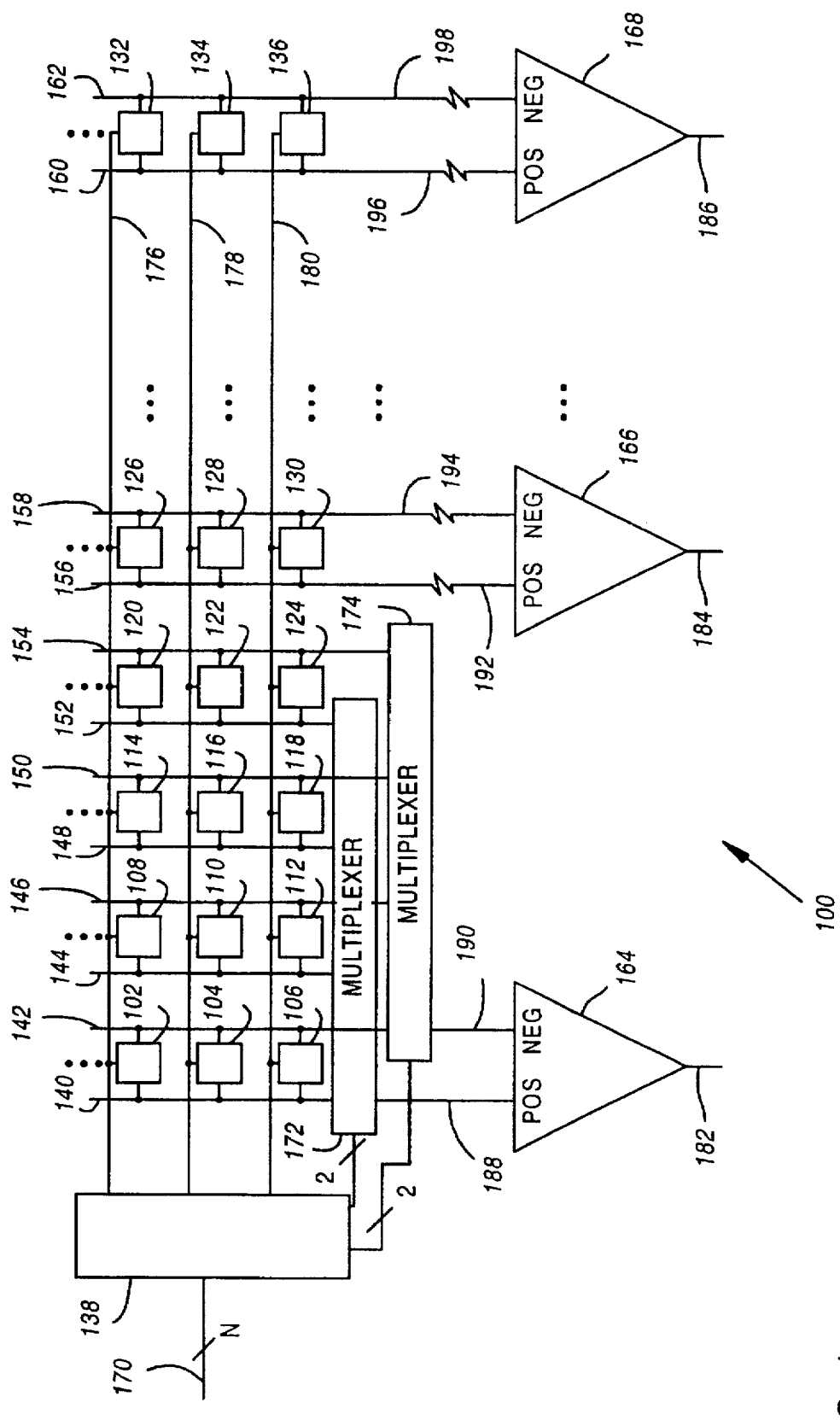
FIG. 1 is a schematic illustrating various components of an SRAM cross-section.

SRAMs 100 (FIG. 1) are frequently used in personal computer cache memories. SRAMs 100 are also used in battery powered devices such as calculators, telephones and the like which require a writeable memory to maintain stored data while a device is turned off. An SRAM 100 may generally comprise a plurality of RAM cells 102–136, as shown in FIG. 1. RAM cells 102–136 are used to store bits of data (logic voltages). When the address 170 of a RAM cell 116 is transmitted by an SRAM's address decoder 138, the identified RAM cell 116 drives appropriate bit lines 148, 150 to which it is connected. Each RAM cell 102–136 in FIG. 1 is associated with positive 140, 144, 148, 152, 156, 160 and negative 142, 146, 150, 154, 158, 162 bit lines, wherein negative bit lines carry signals which are the inverse of those carried on corresponding positive bit lines.

Since RAM cells 102 are very small, and are unable to incorporate large driver circuits, they tend to charge their associated bit lines 140, 142 relatively slowly. To improve the speed at which a RAM cell's stored data can be transmitted from an SRAM 100, bit lines 140, 142 corresponding to a particular RAM cell 102 are used to drive a sense amplifier 164. The sense amplifier 164 is capable of recognizing a stored logic voltage after a RAM cell 102 has driven its associated bit lines 140, 142 to only a fraction of usable logic voltages. The sense amplifier 164 then amplifies the recognized logic voltage and transmits it to another register or location within a microprocessor more quickly than if a RAM cell 102 had to perform this task alone.

RAM cells 102–136 are typically organized in a number of blocks 102–124 comprising an array of RAM cells 102–136. Only one block of RAM cells 102–124 is shown in its entirety in FIG. 1. Each block 102–124 is associated with a single sense amplifier 164. In FIG. 1, each block of the array comprises four columns and $2^{N-2}$ rows of RAM cells 102–124 (note that for ease of explanation, only three of the $2^{N-2}$ RAM cell rows are shown).

In operation, an N bit data address 170 is transmitted to the SRAM's address decoder 138. Two bits of the data address 170 are used to control a pair of column select multiplexers (MUXs) 172, 174. Since the FIG. 1 SRAM 100 is made up of blocks, and each block comprises four columns of RAM cells 102–124, the MUXs 172, 174 are four bit MUXs. One of the MUXs 172 associated with a block 102–124 is used to transmit the data of a single positive bit line (e.g., bit line 148) to a sense amplifier 164, and the other MUX 174 associated with an array 102–124 is used to transmit the data of a single negative bit line (e.g., bit line 150). As is well known in the art, a four bit MUX 172, 174 requires two control lines. The remaining N–2 bits of a data address may therefore be used to select which row of RAM cells in an array will be active. Whereas bit lines 140–162 run vertically in FIG. 1, word lines 176–180 run horizontally. A word line 176 in a 32-bit SRAM 100 might therefore activate 128 RAM cells (102, 108, 114, 120, 126 . . . 132) which in turn would be multiplexed through 64 multiplexers (172 . . . , 174 . . . ), to be amplified by 32 sense amplifiers (164, 166 . . . 168), thereby allowing a 32 bit word (182, 184 . . . 186) to be retrieved from memory 100.

Data is retrieved from memory 100 through the process of an SRAM read operation. The details of SRAM read operations should be familiar to one skilled in the art and will not be described in further detail in this disclosure. In short, a normal SRAM read operation results in each bit line 140–162 being driven by a RAM cell selected by the address decoder 138. A plurality of multiplexors 172–174 then determine which of the bit lines 140–162 will drive the inputs 188–198 to a plurality of sense amplifiers 164–168. The methods and apparatus disclosed herein provide a means for alternatively driving the inputs 188–198 to a plurality of sense amplifiers 164–168 with an external analog voltage.

FIG. 4 shows an integrated circuit 400 comprising an SRAM 100. Because of the large number of sense amplifiers 164–168 in an SRAM 100, it is not feasible to provide package pins 402, 404 (i.e., contact pads), or even wafer pads, for the inputs to each sense amplifier 164–168. Instead, only one pair of pins 402, 404 (one for V(ANALOG_IN_POS), and one for V(ANALOG_IN_NEG), as will be more fully explained below) may be allotted for applying a differential external analog voltage to all of the sense amplifiers 164–168 in an SRAM 100. Due to a limited number of available package pins, it might even be necessary to share the allotted pins 402, 404 with other test features (i.e., through an internal switching device or the like). As will be described below, the test circuitry described herein is used on a very limited basis and requires little use of the external pins 402, 404 through which analog voltages must be applied.

FIG. 2 shows a preferred embodiment of test circuitry used in measuring the offset voltages of a plurality of sense amplifiers 164–168. Note that external analog voltages, denoted ANALOG_IN_POS 202 and ANALOG_IN_NEG 204, are allowed to drive the inputs 188–198 of sense amplifiers 164–168 through a plurality of transmission gates 206–216. Transmission gates 206, 210, 214 connected to a positive sense amplifier input 188, 192, 196 are denoted in FIG. 2 by the marking T+, and transmission gates 208, 212, 216 connected to a negative sense amplifier input 190, 194, 198 are denoted by the marking T–.

Each transmission gate 206–216 comprises an n-channel field effect transistor 218–228 (hereinafter referred to as an "nfet") connected in parallel with a p-channel fet 230–240 (hereinafter referred to as a "pfet"). The gate of each nfet 218–228 is driven by a high test enable signal 242 (TEST_ENABLE_H), and the gate of each pfet 230–240 is driven by a low test enable signal 244 (TEST_ENABLE_L). The test enable signals 242, 244 may be controlled by hardware or software, and are used to place the test circuitry in a test mode. The signals 242, 244 are the dual of one another (i.e., when one signal is at a logic low or logic zero, the other signal is at a logic high or logic one—see the inverting relationship 326 shown in FIG. 3). The following conditions:

TEST_ENABLE_H=1, and

TEST_ENABLE_L=0 therefore place the test circuitry in a test mode, and the conditions:

TEST_ENABLE_H=0, and

TEST_ENABLE_L=1 are used to disable the test circuitry, and to a certain extent, isolate the test circuitry (including analog voltage input pins 402, 404) from other components of the SRAM 200.

When the test circuitry is enabled, an analog voltage carried over the ANALOG_IN_POS signal line will drive the positive input 188, 192, 196 of each and every sense amplifier 164–168 under test. The signal travels from an nfet's source to drain (or vice versa), and from a pfet's source to drain (or vice versa).

Similarly, and while the test circuitry is enabled, an analog voltage carried over the ANALOG_IN_NEG signal line will drive the negative inputs 190, 194, 198 of sense amplifiers 164–168 under test. In this manner, each nfet 218–228 and pfet 230–240 of a transmission gate 206–216 provides a switchable connection between an analog voltage signal line 202, 204 and an input 188–198 to one of the plurality of sense amplifiers 164–168.

The dual fet structure of the transmission gates 206–216 is not a prerequisite to functional test circuitry, but it does aid in reducing signal degradation as signals pass through a transmission gate 206–216. This is important since it is desirable to measure sense amplifier offset voltages with a great deal of accuracy.

To prevent RAM cells 102–136 from driving bit lines 140–162 while a test mode is enabled (and consequently, from fighting transmission gates to drive sense amplifier inputs 188–198), address decoders 138 associated with an SRAM 200 should be disabled while in test mode. Since address decoders are often controlled by either a clock signal 302 or address decoder enable signal, an address decoder 138 may be disabled by logically ANDing the clock signal 302 with a test enable signal 244. In FIG. 3, the clock signal 302 which would typically be used to enable an address decoder 138 is ANDed 304 with the TEST_ENABLE_L signal line 244, thereby producing an enable signal 246 (ENABLE) which deactivates an SRAM's address decoder 138 while test circuitry is operative.

To prevent sense amplifier test circuitry from interfering with the normal operation of an SRAM 200, three features are provided (some or all of which might be used in a specific implementation of the disclosed test circuitry).

The first feature has already been described. When not in test mode, test enable signal lines 242, 244 disable the fets 218–240 of the transmission gates 206–216.

The second feature comprises isolation gates 306, 308 (sometimes referred to in the claims as first switches) which are similar in most respects to transmission gates 206–216 in that they may comprise parallel connected nfets 310, 312 and pfets 314, 316, and the gates of the fets 310, 312, 314, 316 are respectively driven by the high and low test enable signal lines 242, 244. However, the source/drain inputs to the isolation gates 306, 308 are derived from connections to an integrated circuit's package pins 402, 404 (labeled as signal lines ANALOG_PAD_IN_POS 318 and ANALOG_PAD_IN_NEG 320 in FIG. 3, and shown as package pins or contact pads 402, 404 in FIG. 4). The source/drain outputs of the isolation gates 306, 308 drive the analog voltage signal lines ANALOG_IN_POS 202 and ANALOG_IN_NEG 204. (NOTE: Source and drain connections of a fet are presumed to be interchangeable.) The isolation gates 306, 308 may be placed sufficiently distant from an SRAM's RAM cells 102–136 so that extraneous external analog voltages or other interference picked up by an integrated circuit's package pins 402, 404 will not interfere with the normal operation of an SRAM 200. Since RAM cells 102–136 are small, and have little noise immunity, signals carried over the external analog voltage signal lines create a high likelihood of interference with data stored in RAM cells 102–136 or transmitted on bit lines 140–162. The disclosed isolation gates 306, 308 help to solve this problem. In the claims, an isolation gate 306, 308 may sometimes be referred to as a first switch.

The third feature which aids in isolating test circuitry from an SRAM 200 during normal SRAM operation is an nfet 322, 324 having source/drain connections between an analog voltage signal line 202, 204 and ground (sometimes referred to in the claims as second switches). The nfets 322, 324 may be driven by the low test enable signal line 244 so as to pull the analog voltage signal lines 202, 204 to ground when not in use for offset voltage testing. In the claims, an nfet 322, 324 configured in such a manner may sometimes be referred to as a second switch.

After enabling the above test circuitry (i.e., entering a sense amplifier test mode), a differential voltage is applied 502 (FIG. 5) to the plurality of sense amplifiers 164–168 under test. The differential voltage, Vd, will typically be generated by external test equipment 406 comprising a voltage source(s), and may be defined as:

$$Vd=V(ANALOG\_IN\_POS)-V(ANALOG\_IN\_NEG)$$

All, or only a portion of an SRAM's sense amplifiers 164–168 may be implemented with the disclosed test circuitry. Preferably, the applied differential voltage has an absolute value larger than any reasonably expected offset voltage for any of the plurality of tested sense amplifiers 164–168.

After applying a differential voltage 502, an SRAM read operation is performed 504. The read operation 504 will proceed as usual, but for the fact that the sense amplifiers 164–168 will be reading the applied differential voltage rather than data from a plurality of RAM cells 102–136.

After a read operation, the outputs 184–186 of tested sense amplifiers 164–168 must be scanned out of the integrated circuit for interpretation and/or analysis. This output scanning may be performed serially or in parallel. In a serial scan, the outputs 182–186 of sense amplifiers 164–168 might be latched and then scanned out consecutively through a single package pin of an integrated circuit 400. In a parallel scan, the outputs 182–186 of sense amplifiers 164–168 might be latched and then used to temporarily drive a plurality of package pins on an integrated circuit 400. Scan operations are well known in the art and will not be described in further detail herein.

Upon completion of an SRAM read operation 504, each sense amplifier 164–168 will have evaluated to either a logic zero or logic one, depending on the applied differential voltage and a particular sense amplifier's offset voltage, Voffset. A sense amplifier's output 182–186 will evaluate to a logic one if:

$$Vd - Voffset > 0,$$

and a sense amplifier's output will evaluate to a logic zero if:

$$Vd - Voffset < 0.$$

The initially applied differential voltage may be selected so as to cause all sense amplifiers 164–168 to evaluate to a logic one, or so as to cause all sense amplifiers 164–168 to evaluate to a logic zero. By way of example, it will be assumed that Vd is selected so that all of the plurality of sense amplifiers 164–168 under test initially evaluate to a logic one. With this assumption in mind, the differential voltage applied to the plurality of sense amplifiers 164–168 will be decreased 508, 502, and an SRAM read operation 504 repeated, if the output 182–186 of any tested sense amplifier 164–168 is a logic one 506. This process continues until Vd is negative, and has a large enough magnitude such that the output 182–186 of every sense amplifier 164–168 evaluates to zero.

All sense amplifier output information and differential voltage information is scanned out for analysis and interpretation to test equipment 406 comprising a personal computer or the like. The test equipment is preferably programmed to select and compare applied differential voltages corresponding to two sets of sense amplifier output information. The first of these applied differential voltages is the voltage which causes a first of the sense amplifier outputs 182–186 to change polarity (i.e., from a logic one to a logic zero). The second applied differential voltage is the one which causes all of an SRAM's tested sense amplifiers 164–168 to change polarity (i.e., evaluate to zero). Whichever of these two voltages has the greatest absolute value is noted as the offset voltage which must be accounted for in structuring an SRAM's timing budget. In this manner, no more time is allotted for bit line charging than is necessary, and an SRAM 200 can be timed for optimum performance.

Note that the test equipment 406 not only analyzes scanned data, but also signals the test equipment's voltage source(s) when it is necessary to step (i.e., increase or decrease) an applied differential voltage.

After each sense amplifier output 182–186 has changed polarity, and each output 182–186 has been scanned by test equipment 406, sense amplifier test circuitry is isolated from other components of the SRAM 200 by generating appropriate signals on the TEST_ENABLE_H and TEST_ENABLE_L signal lines.

Although the statistical information obtained through successive applications of decreasing differential voltages can be used to programmatically alter an SRAM's timing budget (i.e., through software controls), statistical data can also be obtained prior to mass fabrication of an integrated circuit 400 comprising an SRAM 200. If a plurality of sense amplifiers' offset voltages are lower than initial estimates, RAM cells 102–136 can be down-sized, thereby yielding a smaller SRAM 200. Since an SRAM 200 may comprise thousands of RAM cells 102–136, cell downsizing can save a significant amount of surface area on an integrated circuit 400. Alternatively, SRAM clock speeds could be increased to take advantage of lower offset voltages, thereby yielding a faster SRAM 200.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method of measuring the offset voltages of a plurality of sense amplifiers in an SRAM, the method comprising the steps of:
    a) applying a differential voltage to the plurality of sense amplifiers;
    b) performing an SRAM read operation; and
    c) if an output of any of the plurality of sense amplifiers has yet to change polarity, stepping the differential voltage applied to the plurality of sense amplifiers and repeating the SRAM read operation.

2. A method as in claim 1, wherein the step of applying a differential voltage to the plurality of sense amplifiers comprises the step of:
    applying a differential voltage which has an absolute value larger than any reasonably expected offset voltage value for any of the plurality of sense amplifiers.

3. A method as in claim 1, further comprising the steps of:
    a) prior to applying a differential voltage to the plurality of sense amplifiers, enabling a sense amplifier test mode within the SRAM; and
    b) after the output of each of the plurality of sense amplifiers has changed polarity, isolating sense amplifier test circuitry from other components of the SRAM.

4. A method as in claim 3:
    a) wherein the step of enabling a sense amplifier test mode comprises the step of disabling all address decoders associated with the SRAM; and
    b) wherein the method further comprises the step of:
        in parallel with the step of isolating sense amplifier test circuitry from other components of the SRAM, enabling all of the address decoders associated with the SRAM.

5. A method as in claim 1, further comprising the step of:
    prior to applying a differential voltage to the plurality of sense amplifiers, disabling all address decoders associated with the SRAM.

6. A method as in claim 1, wherein the step of applying a differential voltage to the plurality of sense amplifiers comprises the step of:
    driving inputs to the plurality of sense amplifiers with external analog voltage signals.

7. A method as in claim 6, wherein the step of driving inputs to the plurality of sense amplifiers comprises the step of:
    activating a plurality of transmission gates connecting the external analog voltage signals to inputs of the plurality of sense amplifiers.

8. A method as in claim 6, wherein the step of applying a differential voltage to the plurality of sense amplifiers further comprises the step of:
    applying external analog voltage signals to a pair of contact pads located on an exterior of an integrated circuit comprising the SRAM.

9. A method as in claim 1, further comprising the step of:
    using statistical data generated during SRAM read operations to adjust a timing budget of the SRAM.

10. A method as in claim 9, wherein the step of adjusting the SRAM's timing budget comprises the step of:

using software to reprogram selected parameters of the SRAM.

11. Apparatus for measuring the offset voltages of an SRAM's sense amplifiers, the apparatus comprising:

a) means for applying a differential voltage to the plurality of sense amplifiers;

b) means for performing an SRAM read operation; and c) means, responsive to which outputs of the plurality of sense amplifiers have changed polarity, for stepping the differential voltage applied to the plurality of sense amplifiers and causing the SRAM read operation to be repeated.

12. Apparatus as in claim 11, further comprising:

a) means for generating statistical data based on the differential voltages applied to, and the outputs of, the plurality of sense amplifiers;

b) means for reprogramming selected parameters of the SRAM in response to said statistical data.

13. Apparatus as in claim 11, further comprising:

means for disabling all address decoders of the SRAM while differential voltages are applied to the plurality of sense amplifiers.

* * * * *